(12) United States Patent
Joo et al.

(10) Patent No.: US 12,167,667 B2
(45) Date of Patent: Dec. 10, 2024

(54) METHOD FOR MEASURING FORCE OF ADHESIVE MEMBER FOR MANUFACTURING DISPLAY DEVICE

(71) Applicant: Samsung Display Co., Ltd., Yongin-si (KR)

(72) Inventors: Soyeon Joo, Yongin-si (KR); Hanho Park, Yongin-si (KR); Jeongeun Park, Yongin-si (KR); Jeongmin Ban, Yongin-si (KR); Joongmok Lee, Yongin-si (KR); Chungseok Lee, Yongin-si (KR); Seoungbum Pyoun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 257 days.

(21) Appl. No.: 17/443,417

(22) Filed: Jul. 26, 2021

(65) Prior Publication Data

US 2022/0216451 A1    Jul. 7, 2022

(30) Foreign Application Priority Data

Jan. 7, 2021    (KR) .......................... 10-2021-0002218

(51) Int. Cl.
*H10K 71/00*    (2023.01)
(52) U.S. Cl.
CPC .................................... *H10K 71/00* (2023.02)
(58) Field of Classification Search
CPC .............. H10K 71/00; H01L 21/67092; H01L 21/67132; H01L 21/67253; H01L 21/67288; H01L 21/67248; H01L 21/67098; H01L 21/68785; H05K 1/189; H05K 3/323
See application file for complete search history.

(56) References Cited

U.S. PATENT DOCUMENTS

| | | | |
|---|---|---|---|
| 5,969,262 A | 10/1999 | Ino et al. | |
| 2003/0232561 A1* | 12/2003 | Yawata | B32B 37/10 |
| | | | 445/24 |

(Continued)

FOREIGN PATENT DOCUMENTS

| | | |
|---|---|---|
| JP | 3100231 B2 | 10/2000 |
| JP | 3156606 B2 | 4/2001 |

(Continued)

*Primary Examiner* — Caleb E Henry
(74) *Attorney, Agent, or Firm* — Lewis Roca Rothgerber Christie LLP

(57) ABSTRACT

An apparatus for manufacturing a display device, includes: a stage; a temperature controlling portion on the stage, and to receive a member seated on the temperature controlling portion; and a jig portion facing the temperature controlling portion, the jig portion to move linearly, and to receive an adhesive member. The jig portion includes: a first support plate; a second support plate facing the first support plate; and a pressurization plate on the first support plate and the second support plate, the pressurization plate to receive the adhesive member thereon. An end of the pressurization plate is spaced further from the member than an end of the first support plate and an end of the second support plate when the member is seated on the temperature controlling portion.

12 Claims, 18 Drawing Sheets

(56) References Cited

U.S. PATENT DOCUMENTS

| | | | | |
|---|---|---|---|---|
| 2005/0233547 A1* | 10/2005 | Noda | .................. | H01L 21/6835 |
| | | | | 438/459 |
| 2006/0252233 A1* | 11/2006 | Honma | ............. | H01L 21/67132 |
| | | | | 438/464 |
| 2010/0032087 A1* | 2/2010 | Takahashi | ......... | H01L 21/67132 |
| | | | | 428/335 |
| 2017/0051184 A1* | 2/2017 | Yoo | .......................... | C09J 7/381 |
| 2022/0216451 A1* | 7/2022 | Joo | ................... | H01L 21/67248 |

FOREIGN PATENT DOCUMENTS

| | | | |
|---|---|---|---|
| JP | 3978889 B2 | 9/2007 | |
| KR | 10-2020-0083099 A | 7/2020 | |

* cited by examiner

METHOD FOR MEASURING FORCE OF ADHESIVE MEMBER FOR MANUFACTURING DISPLAY DEVICE

CROSS-REFERENCE TO RELATED APPLICATION

This application claims priority to and the benefit of Korean Patent Application No. 10-2021-0002218, filed on Jan. 7, 2021, in the Korean Intellectual Property Office, the entire disclosure of which is incorporated by reference herein.

BACKGROUND

1. Field

Aspects of one or more embodiments of the present disclosure relate to an apparatus and a method, and more particularly, to an apparatus and method for manufacturing a display device.

2. Description of the Related Art

A mobile electronic device is widely used. As mobile electronic devices, other than compact electronic devices such as mobile phones, tablet personal computers (PC) have been widely used recently.

To support various functions, mobile electronic devices include a display device for providing visual information such as an image or a video to a user. Recently, as parts for driving a display device have a smaller size, a portion occupied by the display device in an electronic device has been gradually increasing, and a structure that may be bent from a flat state to have a certain angle is also under development.

In the display device as described above, an adhesive member may be used to electrically connect various components to each other. When using the adhesive member, it may be desirable to accurately understand the properties of the adhesive member.

The above information disclosed in this Background section is for enhancement of understanding of the background of the present disclosure, and therefore, it may contain information that does not constitute prior art.

SUMMARY

Various methods have been used to test the properties of an adhesive member according to comparative examples. However, there are no apparatus or method for accurately measuring various properties of an adhesive member. The absence of the accurate understanding of the properties of an adhesive member may cause product defects, and may lead to malfunction of the products.

One or more embodiments of the present disclosure are directed to an apparatus and method for manufacturing a display device, in which properties of an adhesive member may be accurately measured.

Additional aspects and features will be set forth, in part, in the description which follows, and in part, will be apparent from the description, or may be learned by practicing one or more of the presented embodiments of the present disclosure.

According to one or more embodiments of the present disclosure, an apparatus for manufacturing a display device, includes: a stage; a temperature controlling portion on the stage, and configured to receive a member seated on the temperature controlling portion; and a jig portion facing the temperature controlling portion, the jig portion being configured to move linearly, and to receive an adhesive member. The jig portion includes: a first support plate; a second support plate facing the first support plate; and a pressurization plate on the first support plate and the second support plate, the pressurization plate being configured to receive the adhesive member thereon. An end of the pressurization plate is spaced further from the member than an end of the first support plate and an end of the second support plate when the member is seated on the temperature controlling portion.

In an embodiment, the stage may be configured to move linearly in at least one direction.

In an embodiment, the jig portion may be configured to be raised or lowered with respect to a plane of the stage.

In an embodiment, the apparatus may further include a guide portion configured to guide movement of the jig portion, the jig portion being located on the guide portion.

In an embodiment, the apparatus may further include a connection portion between the jig portion and the guide portion, the connection portion being configured to linearly move the jig portion.

In an embodiment, the apparatus may further include a measurement portion configured to measure a pressure applied to the adhesive member when the adhesive member is attached to the member.

In an embodiment, the apparatus may further include a jig temperature controlling portion on the jig portion, and configured to control a temperature of the pressurization plate.

In an embodiment, the jig portion may further include a member fixing portion configured to hold an end of the adhesive member.

According to one or more embodiments of the present disclosure, a method of manufacturing a display device, includes: arranging an adhesive member on a jig portion; arranging a member on a stage; attaching the adhesive member to the member by linearly moving the jig portion; separating the adhesive member from the member by linearly moving the jig portion; and measuring a force or a pressure applied to the jig portion when attaching the adhesive member to the member or separating the adhesive member from the member.

In an embodiment, the method may further include controlling a temperature of at least one of the adhesive member and the member.

In an embodiment, the method may further include applying an amount of the force or the pressure to the adhesive member by using the jig portion when attaching the adhesive member to the member.

In an embodiment, the method may further include applying the amount of the force or the pressure for a period of time.

In an embodiment, the measuring of the force or the pressure applied to the jig portion may include measuring a lowest value of the force or the pressure applied to the jig portion when separating the adhesive member from the member.

In an embodiment, the method may further include fixing an end of the adhesive member to the jig portion.

In an embodiment, the method may further include linearly moving the stage.

In an embodiment, the method may further include measuring a time when a target force or a target pressure is reached according to a type of the adhesive member.

In an embodiment, the method may further include calculating an area of a graph corresponding a variation in a pressure applied by the jig portion to the adhesive member over time when the jig portion presses the adhesive member, according to a type of the adhesive member.

In an embodiment, the method may further include varying the force or the pressure applied to the member by using the adhesive member.

In an embodiment, a temperature controlling portion may be located between the member and the stage.

In an embodiment, the method may further include controlling a temperature of at least one of the jig portion and the temperature controlling portion.

In addition to the above aspects and features, other aspects and features will be understood from the following detailed description, drawings, and claims and their equivalents.

Embodiments of the present disclosure may be implemented by using a system, a method, a computer program, or a combination of the system, the method, and the computer program.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which.

DETAILED DESCRIPTION

Figure 1:
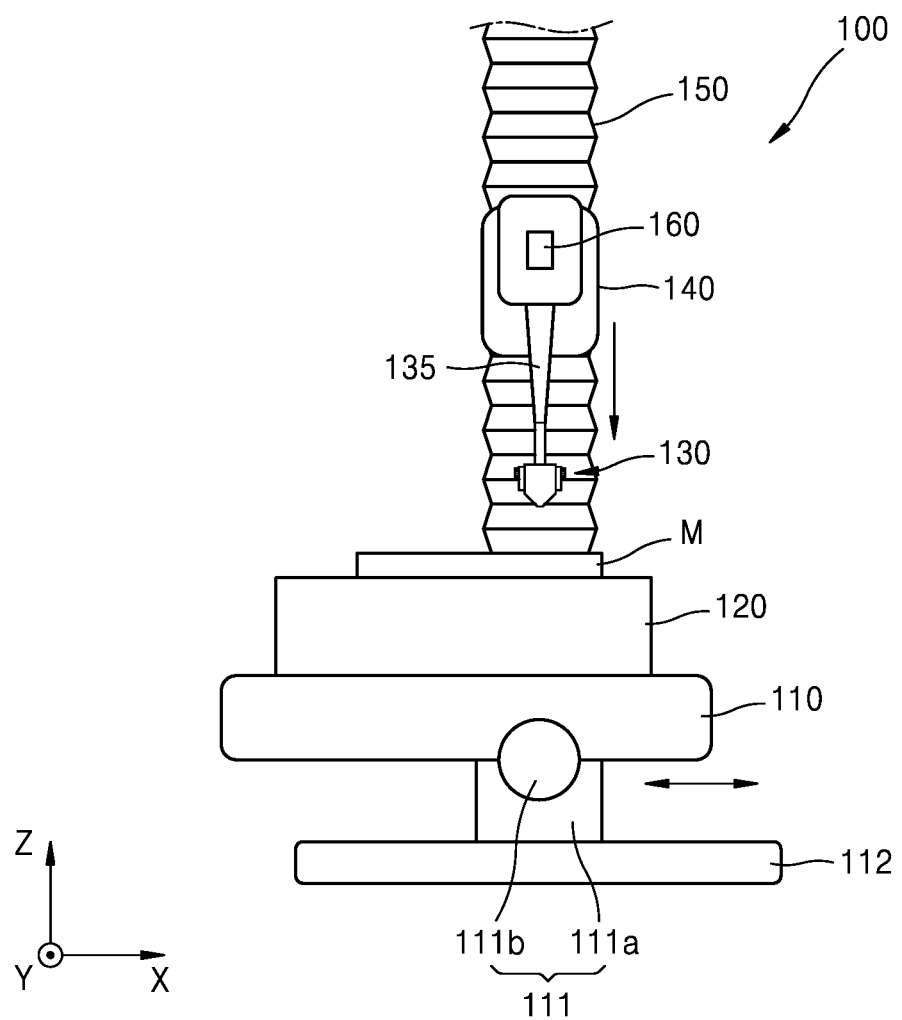
FIG. 1 is a front view of an apparatus for manufacturing a display device, according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
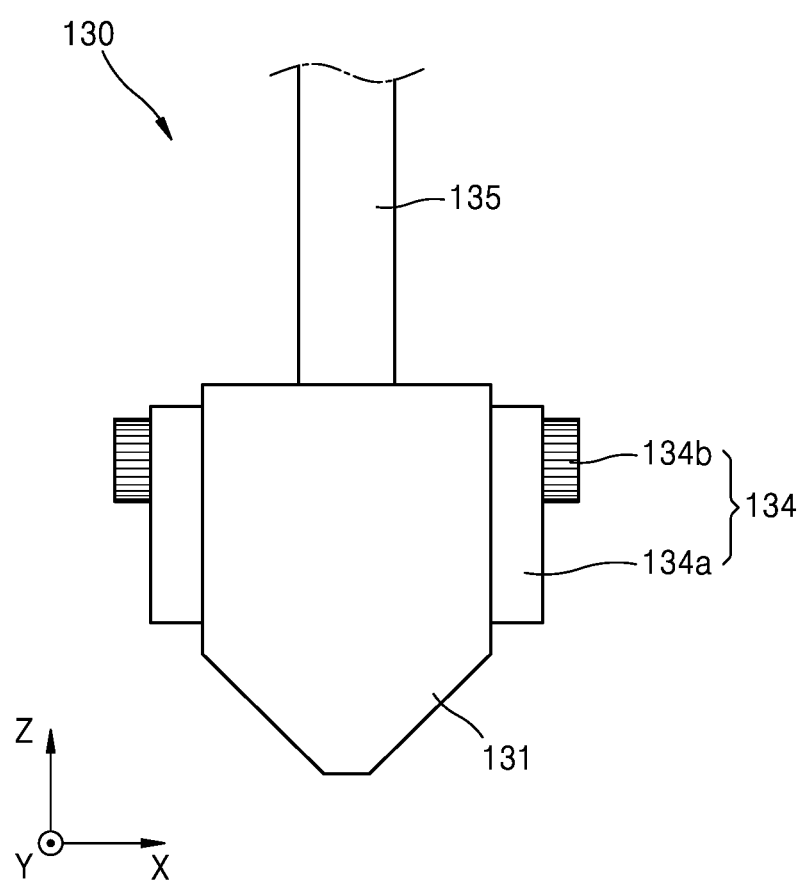
FIG. 2 is a front view of a jig portion illustrated in FIG. 1.
Figure 3:
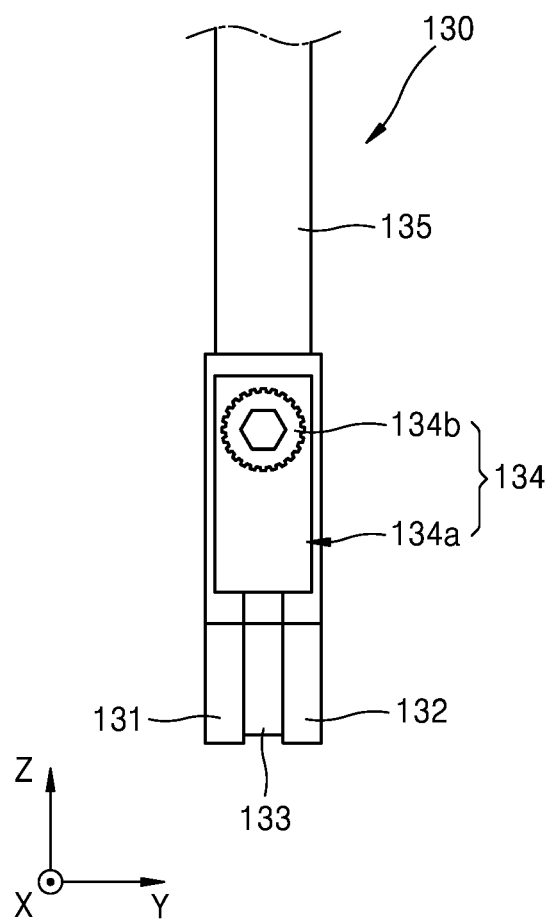
FIG. 3 is a side view of the jig portion illustrated in FIG. 1.

FIG. 1 is a front view of an apparatus for manufacturing a display device, according to an embodiment. FIG. 2 is a front view of a jig portion illustrated in FIG. 1. FIG. 3 is a side view of the jig portion illustrated in FIG. 1.

Referring to FIGS. 1 through 3, an apparatus 100 for manufacturing a display device may include a stage 110, a temperature controlling portion 120, a jig portion 130, a connection portion 140, a guide portion 150, and a measurement portion 160.

The stage 110 may have a plate shape. The stage 110 may be linearly moved in a direction (e.g., in one or more directions). For example, the stage 110 may be moved in an x-axis direction shown in FIG. 1. The stage 110 may also be moved in a y-axis direction shown in FIG. 1. In this case, the stage 110 may make a linear and reciprocal movement in each of the corresponding directions. Here, the stage 110 may be seated on a stage driving portion 111. In this case, the stage driving portion 111 may linearly move the stage 110 in the x-axis direction and/or the y-axis direction, as described above. The stage driving portion 111 may be implemented in various suitable forms. For example, the stage driving portion 111 may include a movement block on which the stage 110 is seated, a screw connected to the movement block to linearly move the movement block, and a motor that is connected to the screw to rotate the screw. According to another embodiment, the stage driving portion 111 may also include a linear motor on which the stage 110 is seated, and which linearly moves the stage 110. According to another embodiment, the stage driving portion 111 may include a cylinder connected to the stage 110, and a linear motion guide on which the stage 110 is seated and which guides the stage 110 during linear movement. The stage driving portion 111 may include a first stage driving portion 111a for moving the stage 110 in the x-axis direction shown in FIG. 1, and a second stage driving portion 111b arranged on the first stage driving portion 111a and for moving the stage 110 in the y-axis direction shown in FIG. 1.

The temperature controlling portion 120 may be arranged on the stage 110. The temperature controlling portion 120 may be integrally formed with the stage 110 as a single body, or may be separately formed from the stage 110 and arranged on the stage 110. The temperature controlling portion 120 may include a heater. The temperature controlling portion 120 may be arranged on an upper surface of the stage 110. According to another embodiment, the temperature controlling portion 120 may be arranged in (e.g., within) the stage 110.

Figure 4A:
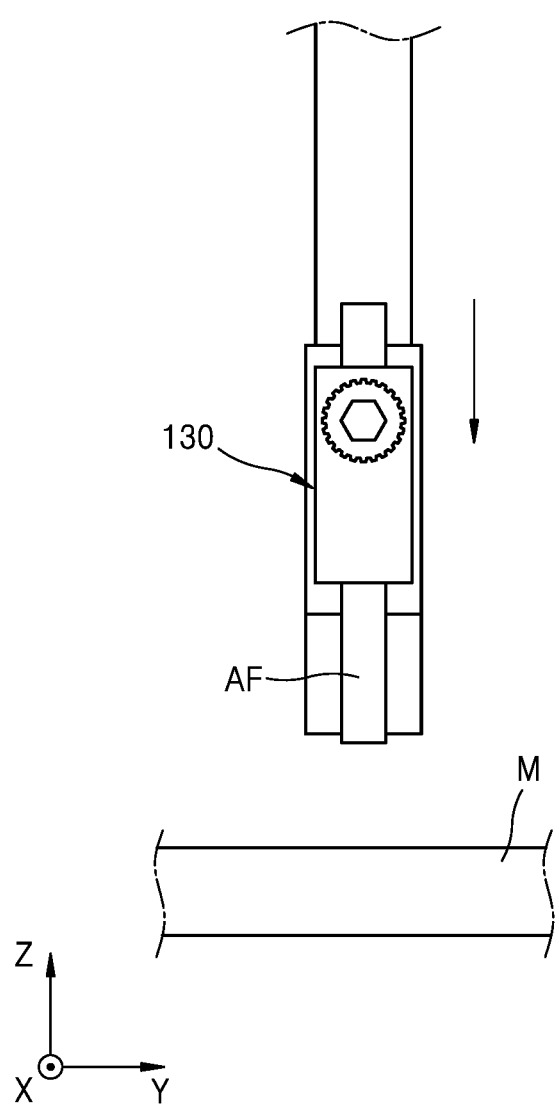
FIGS. 4A-4E are side views illustrating an operation of the jig portion of the apparatus for manufacturing a display device illustrated in FIG. 1.
Figure 4B:
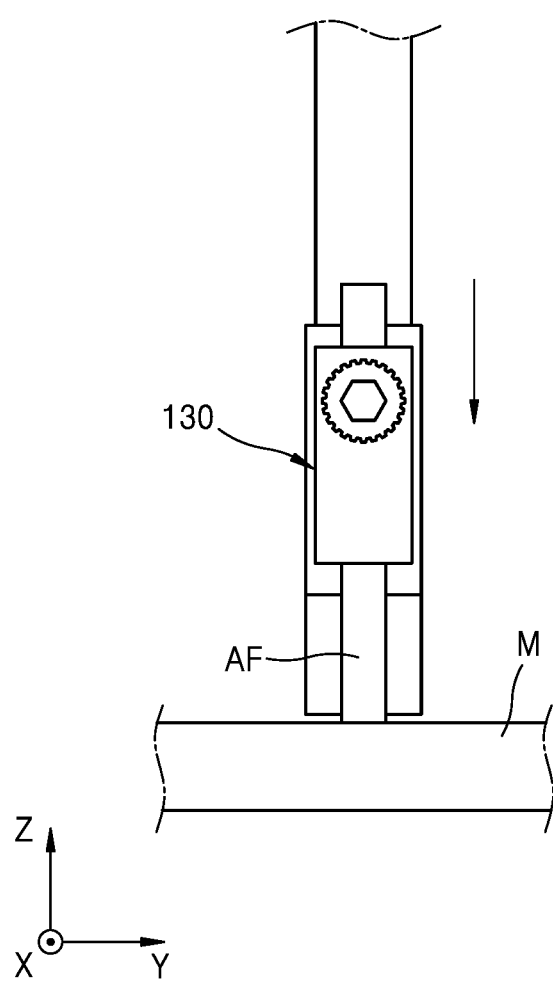
Figure 4C:
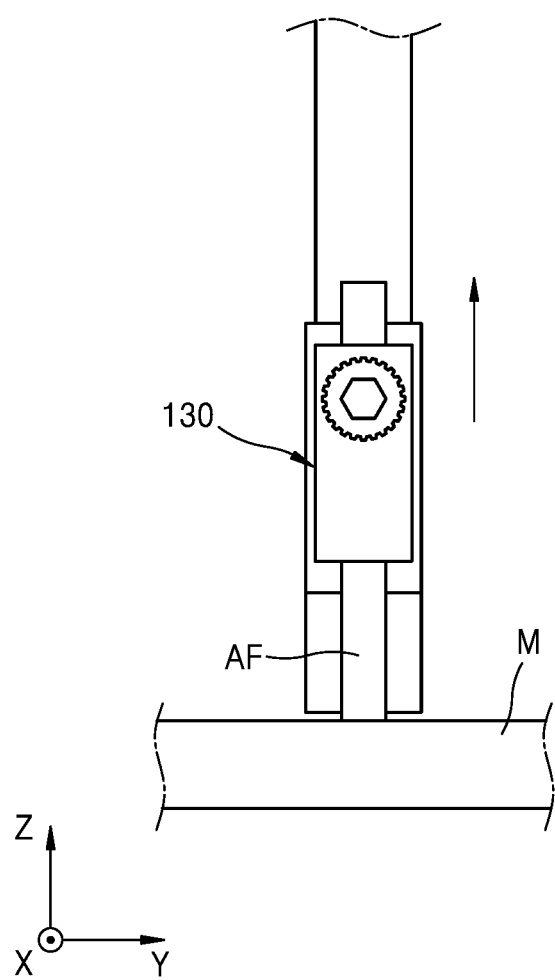
Figure 4D:
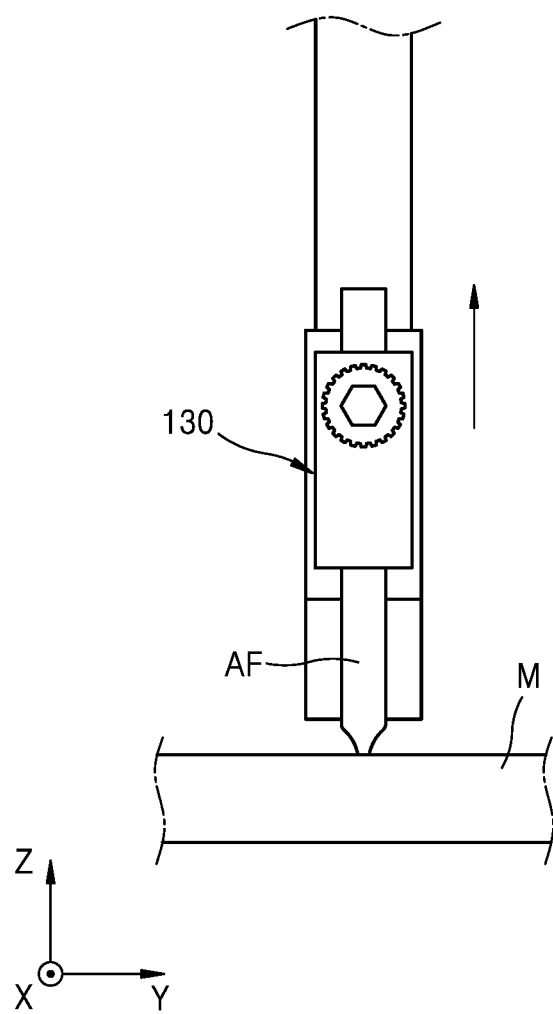
Figure 4E:
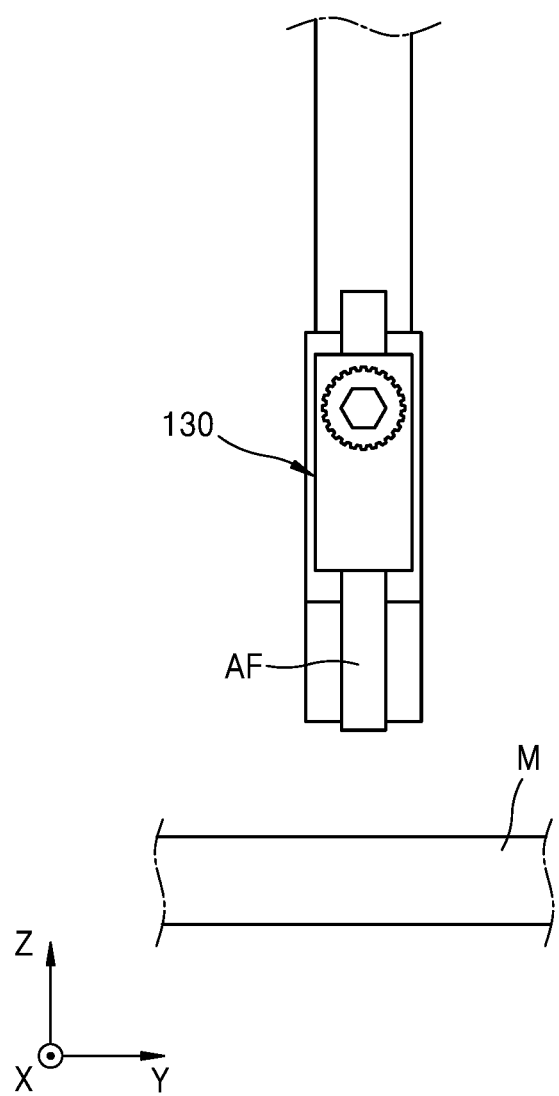

The jig portion 130 may be arranged on the temperature controlling portion 120, and may fix an adhesive member AF (e.g., see FIG. 4A). Also, the jig portion 130 may be linearly moved to be spaced farther apart from, or to be closer to, the temperature controlling portion 120. For example, the jig portion 130 may be moved in a z-axis direction shown in FIG. 1.

The jig portion 130 may include a first support plate 131, a second support plate 132, a pressurization plate 133, a member fixing portion 134, and a jig connection portion 135. The first support plate 131 and the second support plate 132 may be arranged to face each other. The first support plate 131 and the second support plate 132 may be arranged to be spaced apart from each other to form a space therebetween. The pressurization plate 133 may be arranged in the space between the first support plate 131 and the second support plate 132.

Ends of the first support plate 131, the second support plate 132, and the pressurization plate 133 that are arranged to face a member M may be flat or substantially flat. In this case, the end of the first support plate 131, the end of the second support plate 132, and the end of the pressurization plate 133 may ensure a sufficient area of contact between the adhesive member AF and the member M.

The pressurization plate 133 may contact a surface of the adhesive member AF to support the adhesive member AF. An external surface of the pressurization plate 133 may be arranged to be inward relative to an external surface of the first support plate 131 and an external surface of the second support plate 132. In other words, as the external surface of the pressurization plate 133 is arranged in the space formed between the first support plate 131 and the second support plate 132, a step may be formed by the external surfaces of the first support plate 131 and the second support plate 132 and the external surface of the pressurization plate 133. A distance may be formed between the external surface of the pressurization plate 133 and the external surface of the second support plate 132, and the distance may be less than or equal to a thickness of the adhesive member AF. In other words, in this case, the adhesive member AF may be arranged in a space (e.g., a gap or a channel) formed by (e.g., defined between) the first support plate 131, the second support plate 132, and the pressurization plate 133.

A temperature of the pressurization plate 133 may vary. For example, a heater may be included in the pressurization plate 133 to apply heat to the adhesive member AF.

As another example, a temperature of at least one of the first support plate 131 and the second support plate 132 may also vary. In this case, at least one of the first support plate 131 and the second support plate 132 may include a heater.

In the above described examples, a temperature of the adhesive member AF may be controlled as a temperature of the jig portion 130 is varied (e.g., is changed).

The first support plate 131, the second support plate 132, and the pressurization plate 133 may be separate elements or members from each other. According to another embodiment, the first support plate 131, the second support plate 132, and the pressurization plate 133 may be integrally formed with one another as a single body. Hereinafter, for convenience of description, the first support plate 131, the second support plate 132, and the pressurization plate 133 that are integrally formed with one another as a single body will be described in more detail.

The member fixing portion 134 may be arranged on at least one of the first support plate 131, the second support plate 132, and/or the pressurization plate 133. The member fixing portion 134 may fix an end of the adhesive member AF. Here, the member fixing portion 134 may include a fixing plate 134a arranged to face a side surface of the first support plate 131 and a side surface of the second support plate 132, and a distance controller 134b for controlling a distance between the fixing plate 134a and the side surface of the first support plate 131 and/or a distance between the fixing plate 134a and the side surface of second support plate 132. The distance controller 134b may include a screw, a bolt, or the like. In this case, the distance controller 134b may be rotatably connected to the pressurization plate 133. In other words, an end of the distance controller 134b may be inserted into the pressurization plate 133. A pressure (or a force) whereby the fixing plate 134a presses the adhesive member AF may be controlled by rotating the distance controller 134b, such that a portion of the distance controller 134b is further inserted into the pressurization plate 133 when compared to an initial position, or further withdrawn from the external surface of the pressurization plate 133 when compared to the initial position.

The jig connection portion 135 may connect the first support plate 131, the second support plate 132, and the pressurization plate 133 to the connection portion 140. The jig connection portion 135 may have a bar shape.

The connection portion 140 may be connected to the jig portion 130, and may move together with the jig portion 130 when the jig portion 130 makes a linear movement. For example, the connection portion 140 may be moved linearly or reciprocally in the z-axis direction shown in FIG. 1. According to another embodiment, the connection portion 140 may be connected to the jig portion 130 and may not be moved, but only the jig portion 130 may be linearly moved.

The guide portion 150 may guide movement of the jig portion 130 when the jig portion 130 is driven. In this case, at least one of the guide portion 150 and the connection portion 140 may linearly move the jig portion 130. For example, the guide portion 150 may include a linear motor, and may be connected to the connection portion 140 to linearly move the connection portion 140, thereby linearly moving the jig portion 130. In this case, a rail of the guide portion 150 may be fixed, and the connection portion 140 may be connected to (e.g., coupled to or attached to) a movement block for moving on the rail. According to another embodiment, the guide portion 150 may include a screw and a motor, and the connection portion 140 may be seated on the screw to linearly move according to rotation of the screw. In this case, the connection portion 140 may not linearly move the jig portion 130. According to another embodiment, the guide portion 150 may be connected to the connection portion 140, and the connection portion 140 may have a cylinder shape and may be connected to the jig portion 130 to linearly move the jig portion 130 according to an operation of the connection portion 140. According to another embodiment, the guide portion 150 may include a linear motion guide, and may guide linear movement of the connection portion 140 when a cylinder connected to the connection portion 140 is operated. According to another embodiment, the guide portion 150 may be in a rack gear form, and the connection portion 140 may include a motor and a spur gear, such that the connection portion 140 makes linear movement according to the guide portion 150. According to another embodiment, the connection portion 140 may be linearly moved relative to the guide portion 150, and may include a cylinder such that the jig portion 130 may be linearly moved regardless of movement of the connection portion 140. For convenience of description, however, the guide portion 150 having a linear motor shape and connected to the connection portion 140 will be described in more detail hereinafter.

The guide portion 150 may be connected to the jig portion 130 via the connection portion 140. In this case, the guide portion 150 may be connected to the stage driving portion 111 via the stage 110. Also, the guide portion 150 may be arranged such that the connection portion 140 may linearly move, and may support the connection portion 140 and the jig portion 130.

The measurement portion 160 may be arranged on the connection portion 140. The measurement portion 160 may measure a force (or a pressure) applied by the jig portion 130 to the adhesive member AF, or a force (or a pressure) applied by the adhesive member AF to the jig portion 130. As another example, the measurement portion 160 may measure a force (or a pressure) generated in the jig portion 130. In this case, the measurement portion 160 may include a sensor for measuring a pressure. In more detail, the measurement portion 160 may be arranged at (e.g., in or on) a portion connecting the jig portion 130 to the connection portion 140, and may measure a force (or a pressure) generated in the jig portion 130.

The guide portion 150 and the stage driving portion 111 may be supported by a support 112. The support 112 may have a plate shape. According to an embodiment, the stage driving portion 111 may be connected to the support 112 via the guide portion 150. According to another embodiment, the first stage driving portion 111a may be arranged on the support 112, and the stage 110 may be connected to the first stage driving portion 111a via the second stage driving portion 111b.

Hereinafter, an operation of the apparatus 100 for manufacturing a display device will be described in more detail.

FIGS. 4A through 4E are side views illustrating an operation of the jig portion 130 of the apparatus 100 for manufacturing a display device illustrated in FIG. 1.

Referring to FIGS. 4A through 4E, a user may conduct an experiment by using the apparatus 100 for manufacturing a display device illustrated in FIG. 1, for example, to identify properties of the adhesive member AF.

In more detail, a user may cut the adhesive member AF, and may fix the adhesive member AF to the jig portion 130. In this case, the adhesive member AF may be wound in a roll form, and the user may cut the adhesive member AF to a width that is suitable for (e.g., that is the same or substantially the same as) an actually used width. The adhesive member AF may be an anisotropic conductive film (ACF).

When the adhesive member AF is prepared as described above, the adhesive member AF may be fixed to the jig portion 130 via the member fixing portion 134. Also, the member M may be arranged on the temperature controlling portion 120. The member M may be implemented in various suitable forms. For example, the member M may include a display device. According to another embodiment, the member M may include some layers of a display device. In more detail, the member M may include a substrate, a thin-film transistor arranged on the substrate, and an organic light-emitting diode arranged on the thin-film transistor. According to another embodiment, the member M may include an indium tin oxide (ITO) glass. The member M is not limited to the above described examples, and the member M may be implemented in various suitable forms, for example, such as an intermediate product of a manufacturing process of a display device, a form used in a manufacturing process, or a final product.

When the member M is arranged on the temperature controlling portion 120, the stage driving portion 111 may move the stage 110 to arrange the member M to correspond to an initial position (e.g., a predetermined or preset initial position). For example, the stage driving portion 111 may linearly move the stage 110 in one or more directions.

When the above process is completed, the jig portion 130 may be lowered to attach the adhesive member AF to the member M. The jig portion 130 may press the member M with a suitable force (e.g., a predetermined or certain force), and the adhesive member AF may be attached to the member M according to the force.

When the jig portion 130 presses the member M, the measurement portion 160 may measure a force (or a pressure) applied to the jig portion 130, or a force (or a pressure) applied by the jig portion 130. In this case, the measurement portion 160 may measure a force (or a pressure) whereby the jig portion 130 presses the member M. Hereinafter, for convenience of description, the measurement portion 160 for measuring a pressure applied by the jig portion 130 or a force applied to the jig portion 130 will be described in more detail.

When the jig portion 130 presses the member M, a force measured by the measurement portion 160 may be gradually increased to reach a target force (e.g., a predetermined or certain target force) Fp (or a target pressure). When the force (or the pressure) measured by the measurement portion 160 is not varied at the target force Fp (or the target pressure), the jig portion 130 may maintain or substantially maintain the force (or the pressure) applied by the jig portion 130 for a suitable period of time (e.g., a predetermined or certain set period of time) at the target force Fp (or the target pressure).

Then, the jig portion 130 may be raised to separate the adhesive member AF apart from the member M. In this case, when the adhesive member AF is detached from the member M, the measurement portion 160 may measure a force (or a pressure) applied to the jig portion 130. In this case, an opposite force (or an opposite pressure) to the force exerted by the jig portion 130 pressing the member M may be measured. In more detail, a force (or a pressure) measured by the measurement portion 160 when the jig portion 130 presses the member M may have a positive value, and when the member M and the adhesive member AF are separated from each other, the force (or the pressure) measured by the measurement portion 160 may have a negative value.

In the above case, the measurement portion 160 may measure a force (or a pressure) applied to the jig portion 130. For example, the measurement portion 160 may monitor, in real time or near real time, the force (or the pressure) until the adhesive member AF and the member M are completely separated from each other.

Other than the above case, the stage 110 may also linearly move in one or more directions. For example, the stage driving portion 111 may move the stage 110 in a suitable direction to conduct an experiment at (e.g., in or on) another portion of the member M. According to another embodiment, the stage driving portion 111 may linearly move the stage 110 in a suitable direction to adjust an angle when the member M and the adhesive member AF come into contact with each other, or an angle when the member M and the adhesive member AF are separated from each other. In more detail, when the adhesive member AF is separated from the member M, the adhesive member AF may be separated from the member M while only one of the ends of the adhesive member AF is held and other ends of the adhesive member AF are adhered to the member M. In this case, in a portion where the adhesive member AF is separated from the member M, in order for a portion of the adhesive member AF from the one of the ends of the adhesive member AF to the other ends thereof adhered to the member M to be maintained or substantially maintained to be perpendicular to or substantially perpendicular to a surface of the member M, the stage 110 may be linearly moved in a suitable direction when separating the adhesive member AF from the member M. In this case, the stage 110 is linearly moved in a movement direction, and the jig portion 130 may linearly move in a direction perpendicular to or substantially perpendicular to the movement direction of the stage 110. The apparatus 100 for manufacturing a display device may obtain various data obtained by separating the adhesive member AF from the member M after attaching the adhesive member AF to the member M by using the above-described operation.

Figure 5:
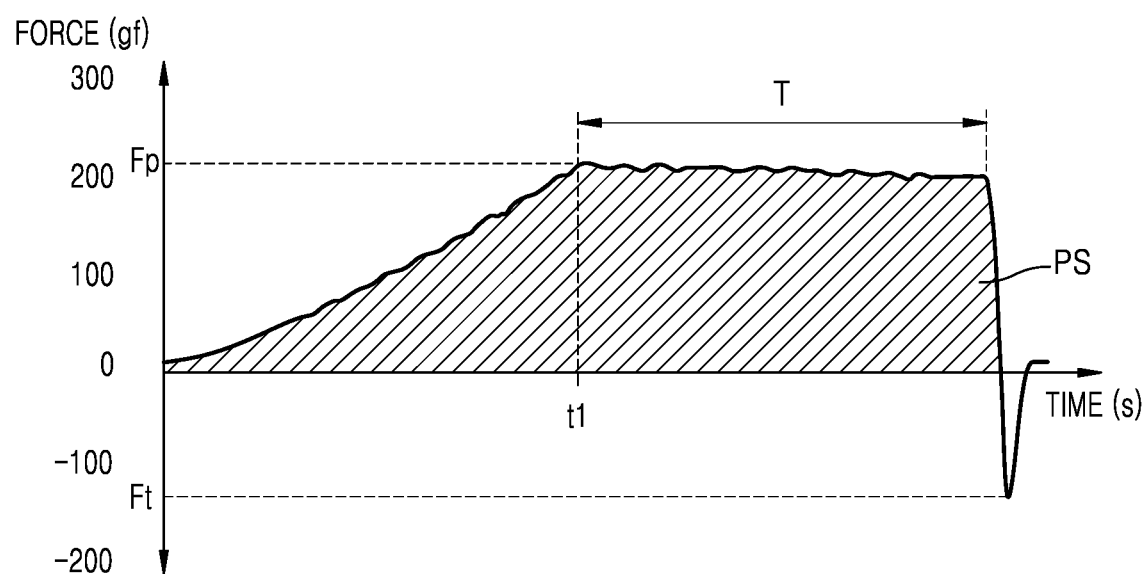
FIG. 5 is a graph showing a relationship between a force applied to the jig portion of the apparatus for manufacturing a display device illustrated in FIG. 1, and time.

FIG. 5 is a graph showing a relationship between a force applied to the jig portion 130 of the apparatus 100 for manufacturing a display device illustrated in FIG. 1, and time.

Referring to FIG. 5, when the jig portion 130 is moved as described above, a force (or a pressure) of the jig portion 130 may be gradually increased, and then maintained or substantially maintained at a target force (e.g., a predetermined or certain target force) Fp (or a target pressure) for a time T. The jig portion 130 is then raised. When the jig portion 130 is raised, the adhesive member AF is separated from the member M to apply a force (or a pressure) to the jig portion 130 due to an adhesive force of the adhesive member AF, and the force (or the pressure) measured by the measurement portion 160 may have a negative value.

In the above case, the apparatus 100 for manufacturing a display device may measure a variation in the force (or the pressure) applied to the jig portion 130 over time as described above, thereby calculating an arrival time t1 until the target force Fp (or the target pressure) is reached when the jig portion 130 presses the member M. The apparatus 100 for manufacturing a display device may calculate an elastic modulus of the adhesive member AF based on the arrival time t1. The elastic modulus of the adhesive member AF may be inversely proportional to the arrival time t1. A hardness of the adhesive member AF before curing may be derived based on the elastic modulus of the adhesive member AF. In this case, the apparatus 100 for manufacturing a display device may include a controller for deriving various results by processing various data. The controller may include various suitable devices, for example, such as a personal computer, a notebook computer, a mobile phone, or the like. According to another embodiment, the controller may include a circuit board including a module or a component capable of performing calculations.

The controller may calculate an initial adhesive force of the adhesive member AF based on a lowest force Ft (or a lowest pressure), which may be a force (or a pressure) having a smallest value of a variation of a force (or a pressure) generated when the adhesive member AF and the member M are separated from each other. For example, the lowest force Ft (or the lowest pressure) may be equal to or proportional to an initial adhesive force of the adhesive member AF.

The apparatus 100 for manufacturing a display device may calculate the initial adhesive force of the adhesive member AF based on the data obtained as described above.

Figure 6:
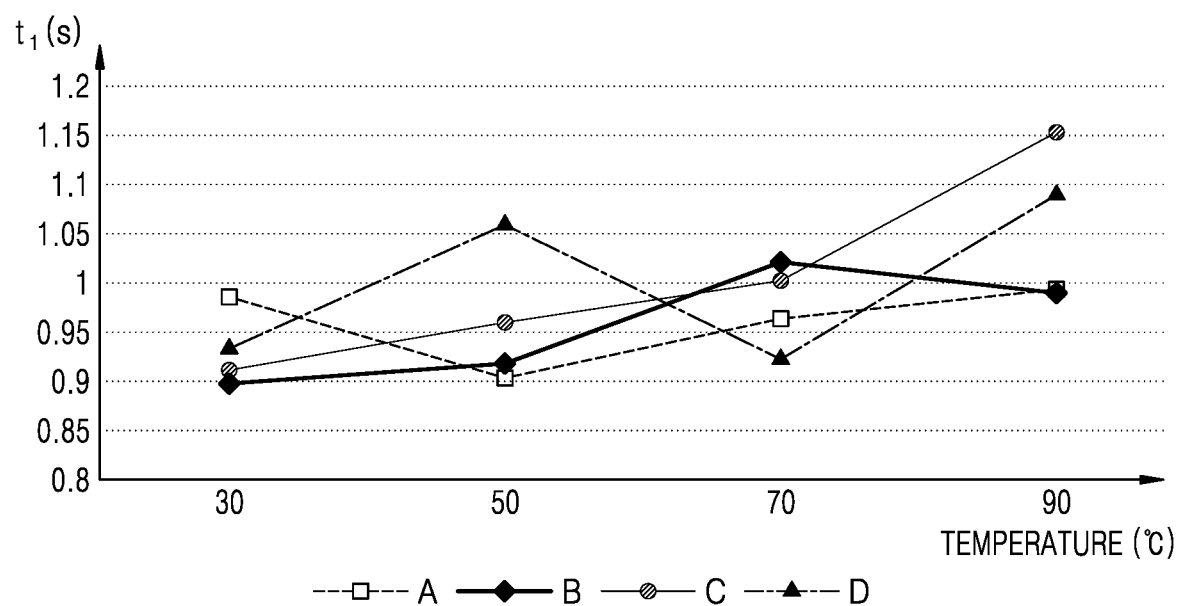
FIG. 6 is a graph showing an arrival time of various types of adhesive members reaching a target force according to temperature, derived using the apparatus for manufacturing a display device illustrated in FIG. 1.

FIG. 6 is a graph showing the arrival time of various types of adhesive members reaching a target force according to temperature, derived using the apparatus for manufacturing a display device illustrated in FIG. 1.

Referring to FIG. 6, the apparatus 100 for manufacturing a display device may calculate arrival times t1 of various different types of the adhesive member AF according to temperature. In more detail, the arrival time t1 may refer to a period of time from a start of a measurement of a force (or a pressure) measured by the measurement portion 160 until the force (or the pressure) reaches the target force Fp (or the target pressure) when the adhesive member AF is brought into contact with the member M and pressed by using the jig portion 130 (e.g., see FIG. 5).

In the above case, the arrival time t1 may vary according to the type of the adhesive member AF. By comparing the arrival times t1, the hardness of each of the different types of adhesive members AF may be compared.

In more detail, when there are four different types of adhesive members AF in total, arrival times t1 of a first adhesive member A, a second adhesive member B, a third adhesive member C, and a fourth adhesive member D may be measured by using the method illustrated in FIGS. 4A through 4E. In this case, each of the arrival times t1 of the first adhesive member A to the fourth adhesive member D may be measured according to each temperature from among a plurality of temperature check points. The arrival times t1 may also be measured by varying the temperature of each adhesive member.

For example, by controlling a temperature of at least one of the temperature controlling portion 120 and the jig portion 130, the temperature of each adhesive member AF may vary. In this case, the arrival times t1 of the respective adhesive members AF may be compared with each other according to respective temperatures of the adhesive members AF.

When the temperature varies as described above, the arrival time t1 of each adhesive member AF may vary according to the temperature. The temperature may be the same or substantially the same as (or similar to) a temperature used in an actual process, and the hardness of each adhesive member AF according to the temperature may be compared by comparing the arrival times t1 according to the temperature of each of the adhesive members AF as described above.

In addition, the hardness of the adhesive members AF according to a process temperature may be predicted to some extent for using each adhesive member AF in an actual process, based on a variation in the hardness of each of the adhesive members AF according to the respective temperatures based on the above results.

Accordingly, the apparatus 100 for manufacturing a display device may be useful for determining an adhesive member AF having a suitable hardness for an actual manufacturing process, based on the above data.

Figure 7:
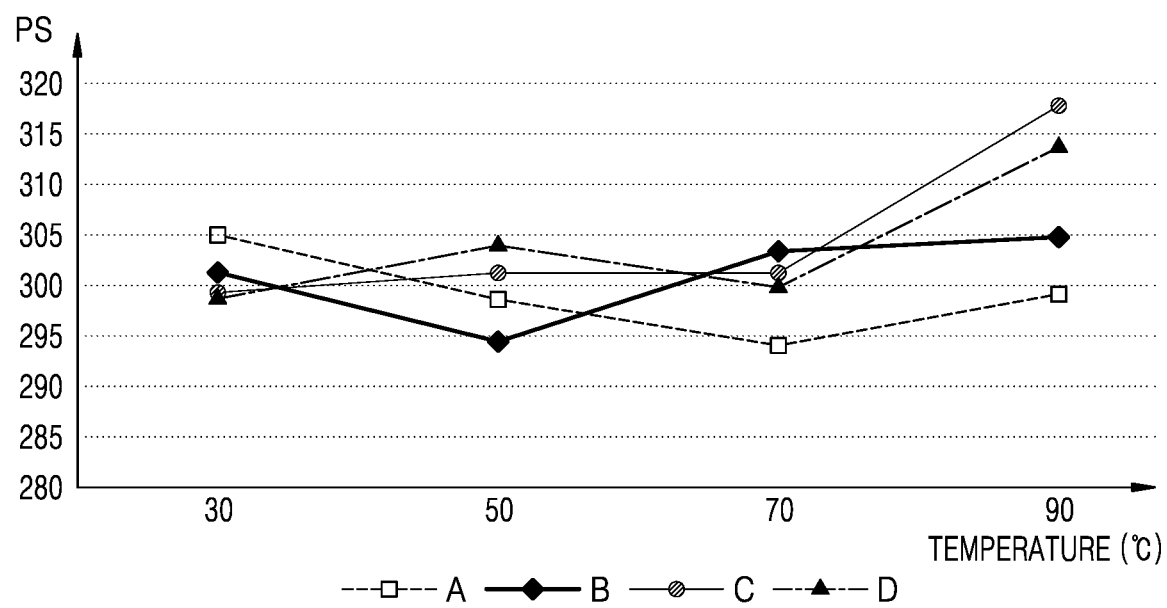
FIG. 7 shows an area of a graph corresponding to a relationship between a force of various types of adhesive members and time according to temperature, which is derived using the apparatus for manufacturing a display device illustrated in FIG. 1.

FIG. 7 shows an area of a graph corresponding to a relationship between a force of various types of adhesive members and time according to temperature, which is derived using the apparatus for manufacturing a display device illustrated in FIG. 1.

Referring to FIG. 7, according to the apparatus 100 for manufacturing a display device, areas of graphs of a force of the adhesive members AF according to temperature and time may be compared.

In more detail, in the graph shown in FIG. 5, an area of the graph corresponding to a portion where the force has a positive value may be calculated from the graph of the force with time. In this case, the area of the graph may indicate a degree of compression of a corresponding adhesive member AF.

The data as described above may be calculated for each adhesive member AF and for each temperature. In other words, by calculating a graph between time and a force while varying a temperature of the first adhesive member A, an area PS of the graph of only a portion where the force has a positive value may be calculated (e.g., see FIG. 5). Accordingly, by calculating the area PS of the graph of the first adhesive member A according to temperature, various information may be obtained (e.g., may be identified), for example, such as how quickly the first adhesive member A is compressed according to the temperature of the first adhesive member A, whether a compressive force of the first adhesive member A decreases, and/or the like. For example, the hardness of the first adhesive member A according to temperature may be compared with those of others in this manner.

The above-described test may also be conducted on the second adhesive member B, the third adhesive member C, and the fourth adhesive member D.

Accordingly, by using the apparatus 100 for manufacturing a display device, a degree of compression of each of the adhesive members AF according to temperature may be obtained, and/or a degree of compression of each of the adhesive members AF may be compared with those of the others by using the above-described operation.

Figure 8:
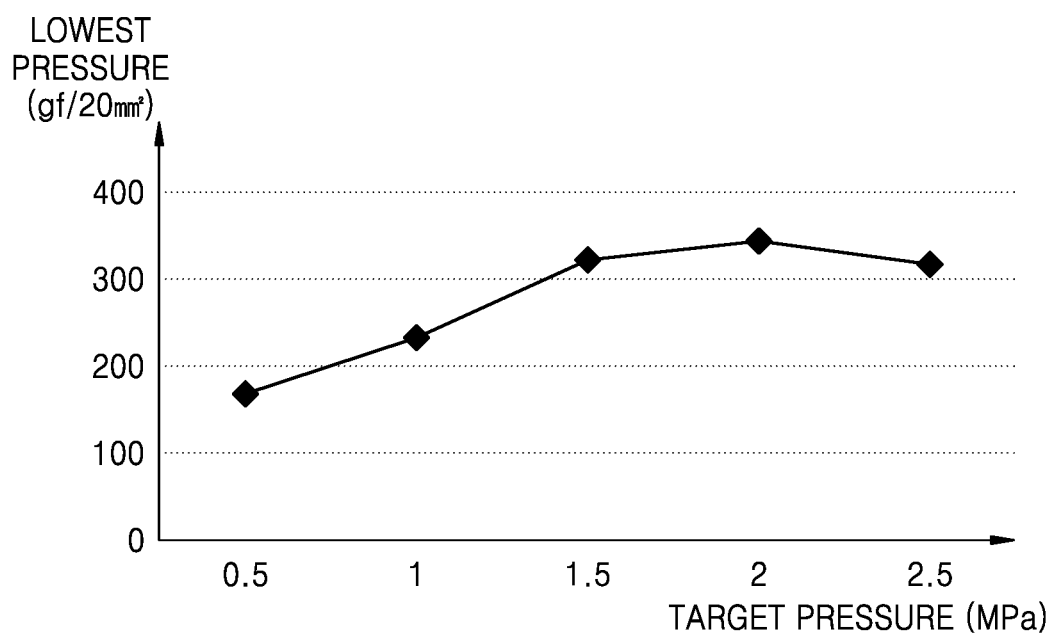
FIG. 8 is a graph showing a lowest pressure measured using the apparatus for manufacturing a display device illustrated in FIG. 1, according to a target pressure.

FIG. 8 is a graph showing a lowest pressure measured using the apparatus for manufacturing a display device illustrated in FIG. 1, according to a target pressure.

Referring to FIG. 8, the apparatus 100 for manufacturing a display device may measure a lowest pressure according to the target pressure of the adhesive member AF. In more detail, the target pressure may be calculated from the target force Fp as illustrated in FIG. 5. In this case, the target pressure may be calculated from the target force Fp that is applied to a unit area, and thus, the target force Fp may be calculated by calculating an area of contact between the adhesive member AF and the member M, and dividing the target force Fp by the area of contact.

The lowest pressure may be calculated from a lowest force Ft. The lowest pressure may be defined as a lowest force generated per area of 20 $mm^2$. However, the present disclosures is not limited thereto, and the lowest pressure may be defined as a lowest force generated in a unit area (e.g., 1 mm$^2$) like the target pressure.

In the above case, a relationship between the lowest pressure and a target pressure of the adhesive member AF may be determined. For example, as the lowest pressure indicates an adhesive force of the adhesive member AF, a target pressure in a period in which the adhesive force of the adhesive member AF is not varied within a suitable range (e.g., a predetermined or certain range), or is within a suitable range of error, may be determined.

In more detail, referring to FIG. 8, the lowest pressure may be similar to about 300 gf/20 mm$^2$, and may not be greatly varied in a period where the target pressure is 1.5 Mpa or higher. However, in a period where the target pressure is less than 1.5 Mpa, the lowest pressure may rise continuously and may be varied greatly.

Accordingly, it may be determined that an adhesive force of the adhesive member AF may be provided more effectively when the target pressure of the adhesive member AF, as a result of the graph illustrated in FIG. 8, is maintained or substantially maintained at 1.5 Mpa or higher.

Thus, according to the apparatus 100 for manufacturing a display device, a target pressure at which an adhesive force of the adhesive member AF may be maximized or improved may be determined according to (e.g., based on) the above results, and may be applied to an actual process (e.g., an actual manufacturing process) where the adhesive member AF is used.

Figure 9A:
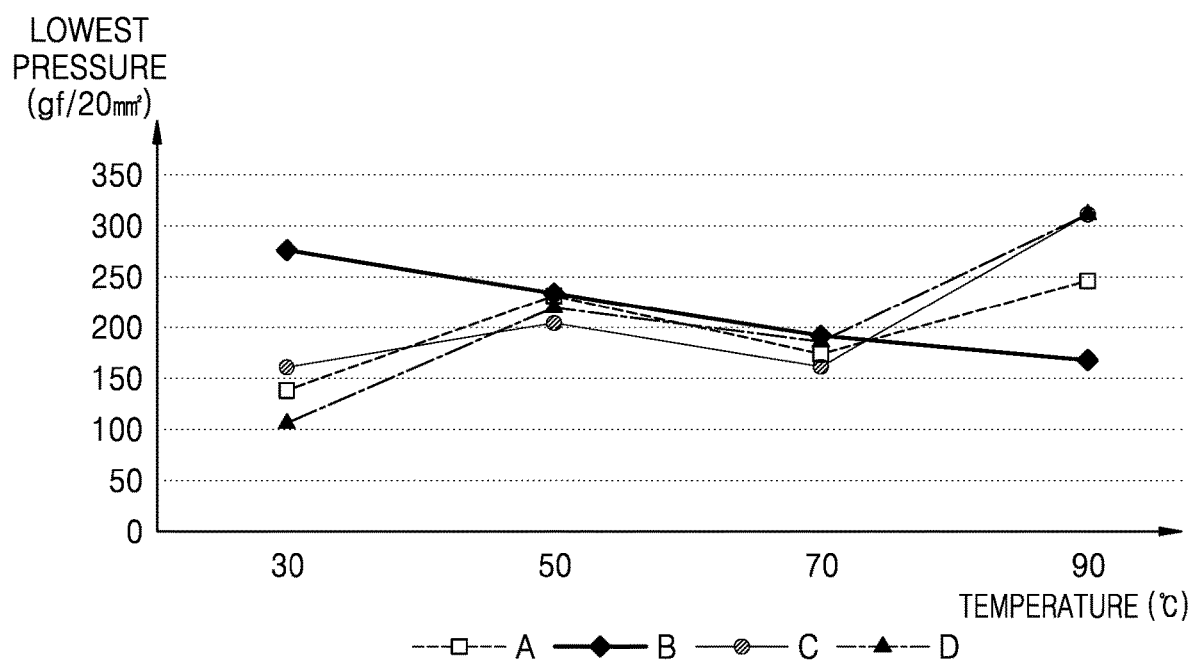
FIG. 9A is a graph showing a lowest pressure according to a temperature, derived using the apparatus for manufacturing a display device illustrated in FIG. 1.
Figure 9B:
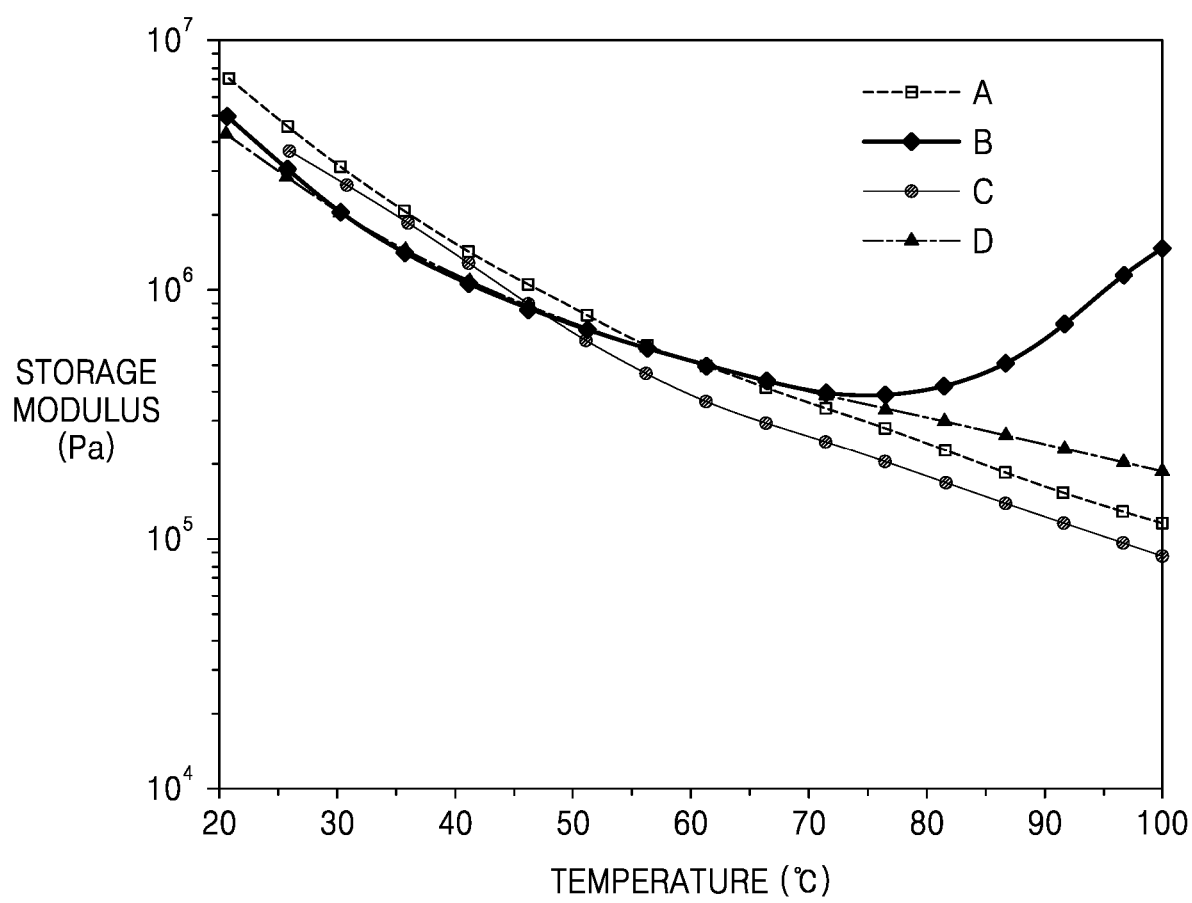
FIG. 9B is a graph showing a storage modulus of various types of adhesive members according to temperature.

FIG. 9A is a graph showing a lowest pressure according to a temperature, derived using the apparatus for manufacturing a display device illustrated in FIG. 1. FIG. 9B is a graph showing a storage modulus of various types of adhesive members according to temperature.

Referring to FIGS. 9A and 9B, according to the apparatus 100 for manufacturing a display device, data of the adhesive member AF may also be analyzed based on a lowest pressure according to temperature. In more detail, a lowest pressure according to temperature of the first adhesive member A may be calculated by varying the temperature of the first adhesive member A. In this case, the graph of the storage modulus illustrated in FIG. 9B may be referred to. In more detail, a storage modulus of the first adhesive member A may decrease as the temperature of the first adhesive member A increases. However, when the temperature of the first adhesive member A exceeds a suitable temperature (e.g., a predetermined or certain temperature (for example, such as a temperature between about 70° C. and 80° C.)), the storage modulus of the first adhesive member A may increase.

When the temperature of the first adhesive member A is increased, the storage modulus thereof is reduced, and thus, flowability thereof is increased to increase an adhesive force of the first adhesive member A. However, when a curing start temperature of the first adhesive member A is exceeded, the first adhesive member A may be pre-cured before being compressed with a member to be adhered thereto, for example, like a flexible printed circuit (FPC), which may cause poor quality.

According to one or more embodiments of the present disclosure, a lowest pressure of each adhesive member AF may be measured according to temperature. In this case, a lowest pressure of the first adhesive member A may increase with respect to a certain temperature. For example, referring to FIG. 9A, in a period in which the temperature is greater than or equal to about 70° C., the lowest pressure of the first adhesive member A increases. Here, as illustrated in FIG. 9B, the storage modulus of the second adhesive member B increases between about 70° C. and about 80° C. Thus, as the second adhesive member B is to be used in a process at 70° C. or lower, when using the second adhesive member B, a process temperature may be adjusted, or the second adhesive member B may not be used at a temperature higher than about 70° C.

The properties of the first adhesive member A, the third adhesive member C, and the fourth adhesive member D in regard to the above characteristics will now be described in more detail. In the case of the first adhesive member A, as the temperature increases, not only does a lowest pressure of the first adhesive member A decrease, but a storage modulus thereof also decreases continuously, and thus, the first adhesive member A may be used in various suitable temperature ranges. Lowest pressures of the third adhesive member C and the fourth adhesive member D decrease as temperature increases, and may increase from 70° C. or higher, similarly to that of the first adhesive member A. Also, storage moduli of the third adhesive member C and the fourth adhesive member D decrease as the temperature increases. In this case, in an operation performed in a period where the temperature is equal to or higher than about 70° C., the hardness of the third adhesive member C and the fourth adhesive member D may be decrease to some extent, but there may be no problems after curing.

As described above, according to the apparatus 100 for manufacturing a display device, various information may be obtained through experiments on different kinds of adhesive members, and actual process conditions may be determined based on the information. Furthermore, an adhesive member that is suitable under actual process conditions may be selected and used based on the obtained information.

Figure 10:
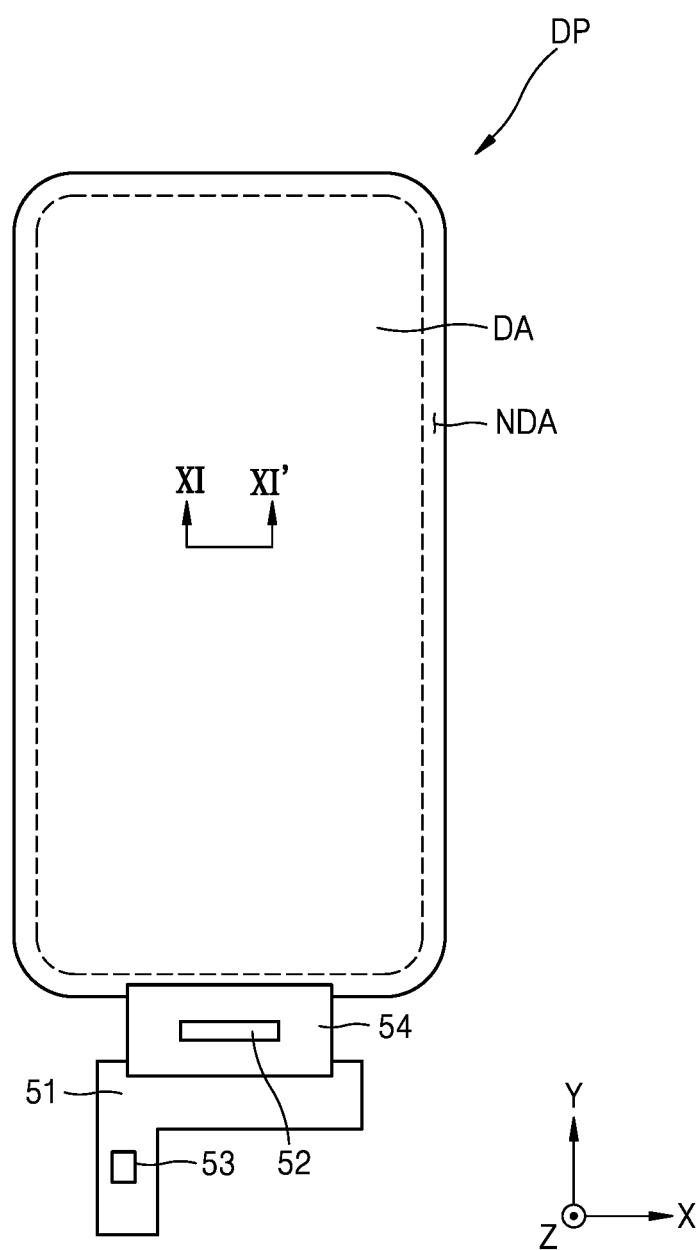
FIG. 10 is a plan view of a display device according to one or more embodiments.
Figure 11:
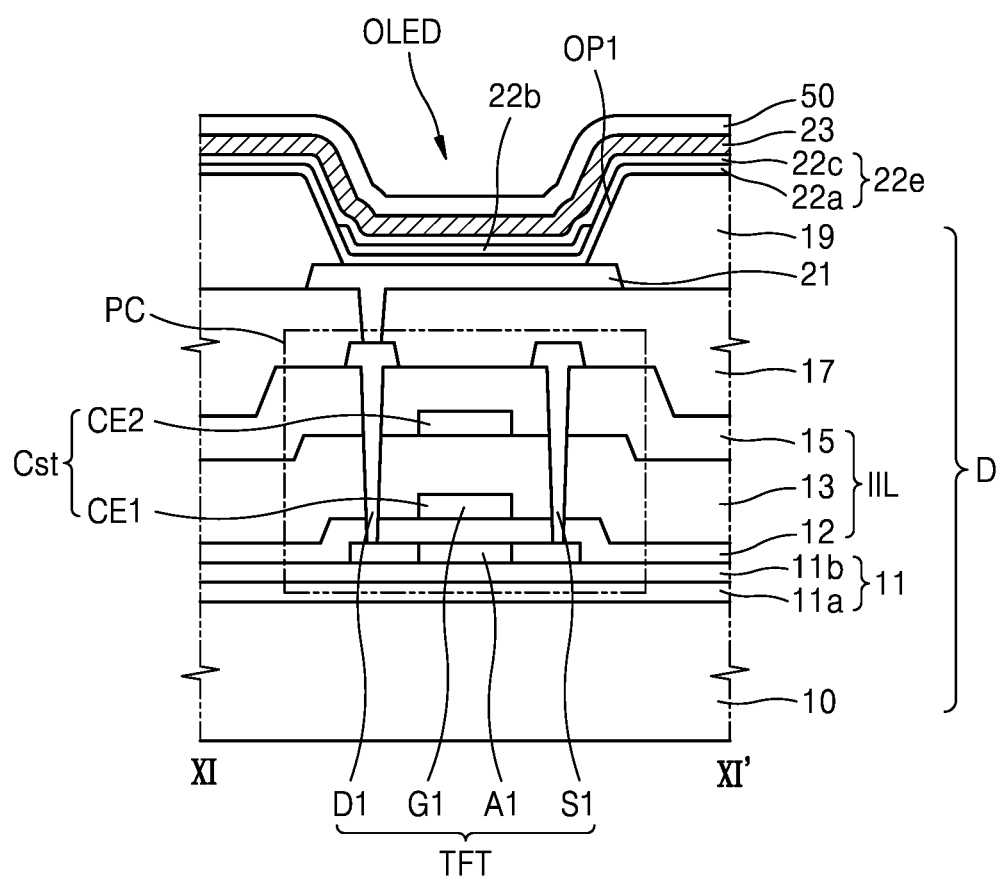
FIG. 11 is a cross-sectional view of the display device taken along the line XI-XI' of FIG. 10.

FIG. 10 is a plan view of a display device according to one or more embodiments. FIG. 11 is a cross-sectional view of the display device taken along the line XI-XI' of FIG. 10.

Referring to FIGS. 10 and 11, a display device DP may include a display panel, a display circuit board 51, a display driver 52, a touch sensor driver 53, and a first flexible film 54. The display panel may be a light-emitting display panel including a light-emitting element. For example, the display panel may include an organic light-emitting display panel using an organic light-emitting diode including an organic emission layer, a micro light-emitting diode (e.g., a micro LED) display panel using a micro LED, a quantum dot light-emitting display panel using a quantum dot light-emitting diode including a quantum dot emission layer, or an inorganic light-emitting display panel using an inorganic light-emitting element including an inorganic semiconductor.

The display panel may be a rigid display panel that is rigid and not easily bent, or a flexible display panel that is flexible and easily bendable, foldable, and/or rollable. For example, the display panel may be a foldable display panel that is foldable and unfoldable, a curved display panel having a bent (e.g., a curved) display surface, a bendable display panel in which areas other than a display surface are bent, a rollable display panel that is rollable and/or unrollable, or a stretchable display panel.

The display panel may be a transparent display panel that is implemented transparently such that objects or backgrounds at a lower surface of the display panel may be viewed from an upper surface of the display panel. As another example, the display panel may be a reflective display panel capable of reflecting an object or a background on the upper surface of the display panel.

The first flexible film 54 may be attached to an edge (e.g., an end) of a side of the display panel. One side of the first flexible film 54 may be attached to the edge (e.g., the end)

of one side of the display panel by using an anisotropic conductive film. The first flexible film 54 may be a flexible film that is bendable.

The display driver 52 may be arranged on the first flexible film 54. The display driver 52 may receive control signals and power voltages, and may generate and output signals and voltages for driving the display panel. The display driver 52 may include an integrated circuit (IC). In this case, the display driver 52 may be arranged directly on the first flexible film 54, or the display driver 52 and the first flexible film 54 may be connected to each other by using an anisotropic conductive film.

The display circuit board 51 may be attached to another side of the first flexible film 54. The other side of the first flexible film 54 may be attached to an upper surface of the display circuit board 51 by using an anisotropic conductive film. The display circuit board 51 may include a flexible printed circuit board (FPCB) that is bendable, a rigid printed circuit board (PCB) that is hard to bend, or a composite printed circuit board including both a rigid printed circuit board and a flexible printed circuit board.

The touch sensor driver 53 may be arranged on the display circuit board 51. The touch sensor driver 53 may be formed using an IC. The touch sensor driver 53 may be attached to the display circuit board 51. The touch sensor driver 53 may be electrically connected to touch electrodes of a touchscreen layer of the display panel via the display circuit board 51.

The touchscreen layer of the display panel may be used to sense a touch input by a user by using at least one of various suitable touch methods, for example, such as a resistive layer method, an electrostatic capacitive method, or the like. For example, when the touchscreen layer of the display panel detects a user's touch input by using an electrostatic capacitive method, the touch sensor driver 53 may apply driving signals to driving electrodes from among the touch electrodes, and may determine whether a touch by a user is made by sensing voltages charged in mutual capacitances between the driving electrodes and sensing electrodes from among the touch electrodes through the sensing electrodes. A touch by a user may include a contact touch and a proximity touch. A contact touch refers to a direct contact of a user's finger or an object, for example, such as a pen, to a cover member arranged on the touchscreen layer. A proximity touch refers to a user's finger or an object, for example, such as a pen, being closely spaced apart from a cover member above the cover member, for example, like hovering. The touch sensor driver 53 may transmit sensor data to a main processor according to sensed voltages, and the main processor may calculate touch coordinates at which a touch input is made, by analyzing the sensor data.

A power supply unit (e.g., a power supply or a power supply circuit) for supplying driving voltages for driving pixels of the display panel, a scan driver, and the display driver 52 may be additionally arranged on the display circuit board 51. As another example, the power supply unit may be integrated with the display driver 52, and in this case, the display driver 52 and the power supply unit may be formed as a single IC.

Various elements as described above may be connected to each other by using an anisotropic conductive film. In this case, an adhesive member may be used as the anisotropic conductive film, the characteristics of which have been identified using the apparatus 100 for manufacturing a display device as described above.

The display panel may be provided by stacking a substrate 10, a buffer layer 11, a circuit layer, and a display element layer on one another.

As described above, the substrate 10 may include an insulating material, for example, such as glass, quartz, or polymer resin. The substrate 10 may be a rigid substrate, or a flexible substrate that is bendable, foldable, and/or rollable.

The buffer layer 11 may be arranged on the substrate 10, and may reduce or block penetration of foreign materials, moisture, and/or external air from below the substrate 10. The buffer layer 11 may provide a flat or substantially flat surface on the substrate 10. The buffer layer 11 may include an inorganic material, for example, such as an oxide or a nitride, an organic material, or an organic-inorganic complex material, and may have a single-layer structure, or a multi-layered structure including an inorganic material and an organic material. In some embodiments, a barrier layer may be further included between the substrate 10 and the buffer layer 11 to prevent or substantially prevent penetration of external air. In some embodiments, the buffer layer 11 may include silicon oxide ($SiO_2$) or silicon nitride ($SiN_x$). The buffer layer 11 may include a first buffer layer 11a and a second buffer layer 11b that are stacked on each other.

The circuit layer may be arranged over the buffer layer 11, and may include a pixel circuit PC, a first gate insulating layer 12, a second gate insulating layer 13, an interlayer insulating layer 15, and a planarization layer 17. The pixel circuit PC may include a thin-film transistor TFT and a storage capacitor Cst.

The thin-film transistor TFT may be arranged on the buffer layer 11. The thin-film transistor TFT may include a first semiconductor layer A1, a first gate electrode G1, a first source electrode S1, and a first drain electrode D1. The thin-film transistor TFT may be connected to an organic light-emitting diode OLED to drive the organic light-emitting diode OLED.

The first semiconductor layer A1 may be arranged over the buffer layer 11, and may include polysilicon. In another embodiment, the first semiconductor layer A1 may include amorphous silicon. In another embodiment, the first semiconductor layer A1 may include an oxide of at least one material selected from among indium (In), gallium (Ga), stannum (Sn), zirconium (Zr), vanadium (V), hafnium (Hf), cadmium (Cd), germanium (Ge), chromium (Cr), titanium (Ti), and/or zinc (Zn). The first semiconductor layer A1 may include a channel region, and a source region and a drain region that are doped with impurities.

The first gate insulating layer 12 may be provided to cover the first semiconductor layer A1. The first gate insulating layer 12 may include an inorganic insulating material, for example, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 12 may have a single-layer structure or multi-layered structure including one or more of the inorganic insulating materials described above.

The first gate electrode G1 may be arranged on the first gate insulating layer 12 to overlap with the first semiconductor layer A1. The first gate electrode G1 may include molybdenum (Mo), aluminum (Al), copper (Cu), titanium (Ti), and/or the like, and may have a single-layer structure or multi-layered structure. For example, the first gate electrode G1 may include a single Mo layer.

The second gate insulating layer 13 may be provided to cover the first gate electrode G1. The second gate insulating layer 13 may include an inorganic insulating material, for example, such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 13 may have a single-layer structure or multi-layered structure including one or more of the inorganic insulating materials described above.

A first upper electrode CE2 of the storage capacitor Cst may be arranged on the second gate insulating layer 13.

At (e.g., in or on) a display area DA, the first upper electrode CE2 may overlap with the first gate electrode G1 therebelow. The first gate electrode G1 and the first upper electrode CE2 overlapping with each other with the second gate insulating layer 13 therebetween may form the storage capacitor Cst. The first gate electrode G1 may serve as (e.g., may be) a first lower electrode CE1 of the storage capacitor Cst.

The first upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single-layer structure or a multi-layered structure including one or more of the above-described materials.

The interlayer insulating layer 15 may cover the first upper electrode CE2. The interlayer insulating layer 15 may include at least one of silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 15 may have a single-layer structure or a multi-layered structure including one or more of the inorganic insulating materials described above.

The first source electrode S1 and the first drain electrode D1 are arranged on the interlayer insulating layer 15. The first source electrode S1 and the first drain electrode D1 may include a conductive material including molybdenum (Mo), aluminum (Al), copper (Cu), titanium (Ti), and/or the like, and may have a single-layer structure or a multi-layered structure including one or more of the above-described materials. For example, the first source electrode S1 and the first drain electrode D1 may have a Ti/Al/Ti multi-layered structure.

The planarization layer 17 may be arranged to cover the first source electrode S1 and the first drain electrode D1. The planarization layer 17 may have a flat or substantially flat upper surface such that a pixel electrode 21 arranged on the planarization layer 17 may be formed to be flat or substantially flat.

The planarization layer 17 may include an organic material or an inorganic material, and may have a single-layer structure or a multi-layered structure. The planarization layer 17 may include a general-purpose polymer, for example, such as benzocyclobutene (BCB), polyimide, hexamethyldisiloxane (HMDSO), polymethylmethacrylate (PMMA), or polystyrene, a polymer derivative having a phenolic group, an acrylic polymer, an imide-based polymer, an aryl ether polymer, an amide polymer, a fluorine polymer, a p-xylene polymer, or a vinyl alcohol polymer. The planarization layer 17 may include an inorganic insulating material, for example, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When forming the planarization layer 17, to provide a flat or substantially flat upper surface after forming the planarization layer 17, chemical mechanical polishing may be performed on the upper surface of the planarization layer 17.

The planarization layer 17 may have a via hole exposing one of the first source electrode S1 and the first drain electrode D1 of the thin-film transistor TFT, and the pixel electrode 21 may contact the first source electrode S1 or the first drain electrode D1 through the via hole to be electrically connected to the main thin-film transistor TFT.

The pixel electrode 21 may include a conductive oxide, for example, such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 21 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. For example, the pixel electrode 21 may have a structure including one or more films including ITO, IZO, ZnO, or $In_2O_3$ above and/or below the above-described reflective layer. In this case, for example, the pixel electrode 21 may have a stacked structure of ITO/Ag/ITO.

A pixel defining layer 19 may cover edges of the pixel electrode 21 on the planarization layer 17, and have a first opening OP1 exposing a center portion of the pixel electrode 21. A light-emitting area of the organic light-emitting diode OLED, or in other words, a size and shape of a subpixel Pm, is defined by the first opening OP1.

The pixel defining layer 19 may prevent or substantially prevent the generation of an arc or the like at the edges of the pixel electrode 21, by increasing a distance between the edges of the pixel electrode 21 and an opposite electrode 23 above the pixel electrode 21. The pixel defining layer 19 may include an organic insulating material, for example, such as polyimide, polyamide, acrylic resin, benzocyclobutene (BCB), hexamethyldisiloxane (HMDSO), and/or phenolic resin, and may be formed by a suitable method such as spin coating.

An emission layer 22b corresponding to the pixel electrode 21 may be arranged at (e.g., in or on) the first opening OP1 of the pixel defining layer 19. A corresponding emission layer 22b may be arranged for each pixel electrode 21 of the plurality of pixels. The emission layer 22b may include a polymer material or a low molecular weight material, and may emit at least one of a suitable colored light, for example, such as a red, green, blue, or white light.

An organic functional layer 22e may be arranged on and/or under the emission layer 22b. The organic functional layer 22e may include a first functional layer 22a and/or a second functional layer 22c. The first functional layer 22a or the second functional layer 22c may be omitted.

The first functional layer 22a may be arranged under the emission layer 22b. The first functional layer 22a may have a single-layer structure or multi-layered structure including an organic material. The first functional layer 22a may include a hole transport layer (HTL) having a single-layer structure. As another example, the first functional layer 22a may include a hole injection layer (HIL) and a hole transport layer (HTL). The first functional layer 22a may be integrally formed to correspond to a plurality of organic light emitting diodes OLED included at (e.g., in or on) the display area DA.

The second functional layer 22c may be arranged on the emission layer 22b. The second functional layer 22c may have a single-layer structure or a multi-layered structure including an organic material. The second functional layer 22c may include an electron transport layer (ETL) and/or an electron injection layer (EIL). The second functional layer 22c may be integrally formed to correspond to a plurality of organic light-emitting diodes OLED included at (e.g., in or on) the display area DA.

The opposite electrode 23 is arranged on the second functional layer 22c. The opposite electrode 23 may include a conductive material having a low work function. For example, the opposite electrode 23 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. As another example, the opposite electrode 23 may further include a layer, for example, such as ITO, IZO, ZnO, or $In_2O_3$, on the (semi)transparent layer including one or more of the above-described materials. The opposite electrode 23 may be integrally formed to correspond to the plurality of organic light-emitting diodes OLED included at (e.g., in or on) the display area DA.

The layers from the pixel electrode 21 to the opposite electrode 23 formed at (e.g., in or on) the display area DA may form the organic light-emitting diode OLED.

An upper layer 50 including an organic material may be formed on the opposite electrode 23. The upper layer 50 may be a layer provided to protect the opposite electrode 23, and may increase light extraction efficiency. The upper layer 50 may include an organic material having a higher refractive index than that of the opposite electrode 23. As another example, the upper layer 50 may be provided by stacking various layers having different refractive indices from one another. For example, the upper layer 50 may be provided by stacking a high refractive index layer/low refractive index layer/high refractive index layer. A refractive index of the high refractive index layer may be 1.7 or more, and a refractive index of the low refractive index layer may be 1.3 or less.

The upper layer 50 may further include LiF. As another example, the upper layer 50 may further include an inorganic insulating material, for example, such as silicon oxide ($SiO_2$) and/or silicon nitride ($SiN_x$). However, the present disclosure is not limited thereto, and the upper layer 50 may be omitted as needed or desired. For convenience of description, an embodiment in which the upper layer 50 is arranged on the opposite electrode 23 is described in more detail.

In some embodiments, the display device DP as described above may include an encapsulation member that shields the upper layer 50. In an embodiment, the encapsulation member may include an encapsulation substrate arranged to face the substrate 10, and a sealing member arranged between the substrate 10 and the encapsulation substrate to block a space between the substrate 10 and the encapsulation substrate from the outside.

In another embodiment, the encapsulation member may include a thin-film encapsulation layer. The thin-film encapsulation layer may be arranged to directly contact the upper layer 50. In this case, the thin-film encapsulation layer may cover the display area DA and a portion of a peripheral area NDA to prevent or substantially prevent penetration of external moisture and oxygen. The thin-film encapsulation layer may include at least one organic encapsulation layer, and at least one inorganic encapsulation layer. Hereinafter, for convenience of description, a case where the thin-film encapsulation layer includes a first inorganic encapsulation layer, an organic encapsulation layer, and a second inorganic encapsulation layer that are sequentially stacked on an upper surface of the upper layer 50 will be described in more detail.

The first inorganic encapsulation layer may cover the opposite electrode 23, and may include silicon oxide, silicon nitride, and/or silicon oxynitride. The first inorganic encapsulation layer is formed along a structure under (e.g., underneath) the first inorganic encapsulation layer, and thus, an upper surface of the first inorganic encapsulation layer may not be flat. The organic encapsulation layer covers the first inorganic encapsulation layer, and unlike the first inorganic encapsulation layer, an upper surface of the organic encapsulation layer may be flat or substantially flat. In more detail, the upper surface of the organic encapsulation layer may be flat or substantially flat in a portion corresponding to the display area DA. The organic encapsulation layer may include at least one of polyethylene terephthalate, polyethylene naphthalate, polycarbonate, polyimide, polyethylene sulfonate, polyoxymethylene, polyarylate, and/or hexamethyldisiloxane (HMDSO). The second inorganic encapsulation layer may cover the organic encapsulation layer, and may include silicon oxide, silicon nitride, and/or silicon oxynitride.

A touchscreen layer may be arranged on the encapsulation member as described above.

Figure 12A:
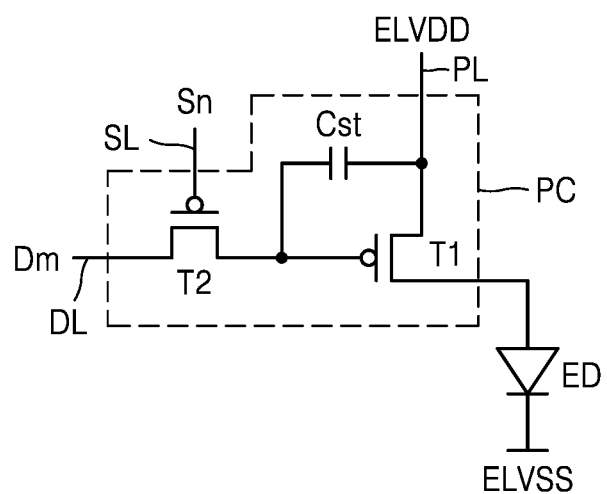
FIGS. 12A-12B are circuit diagrams illustrating a pixel of the display device illustrated in FIG. 10, according to one or more embodiments.
Figure 12B:
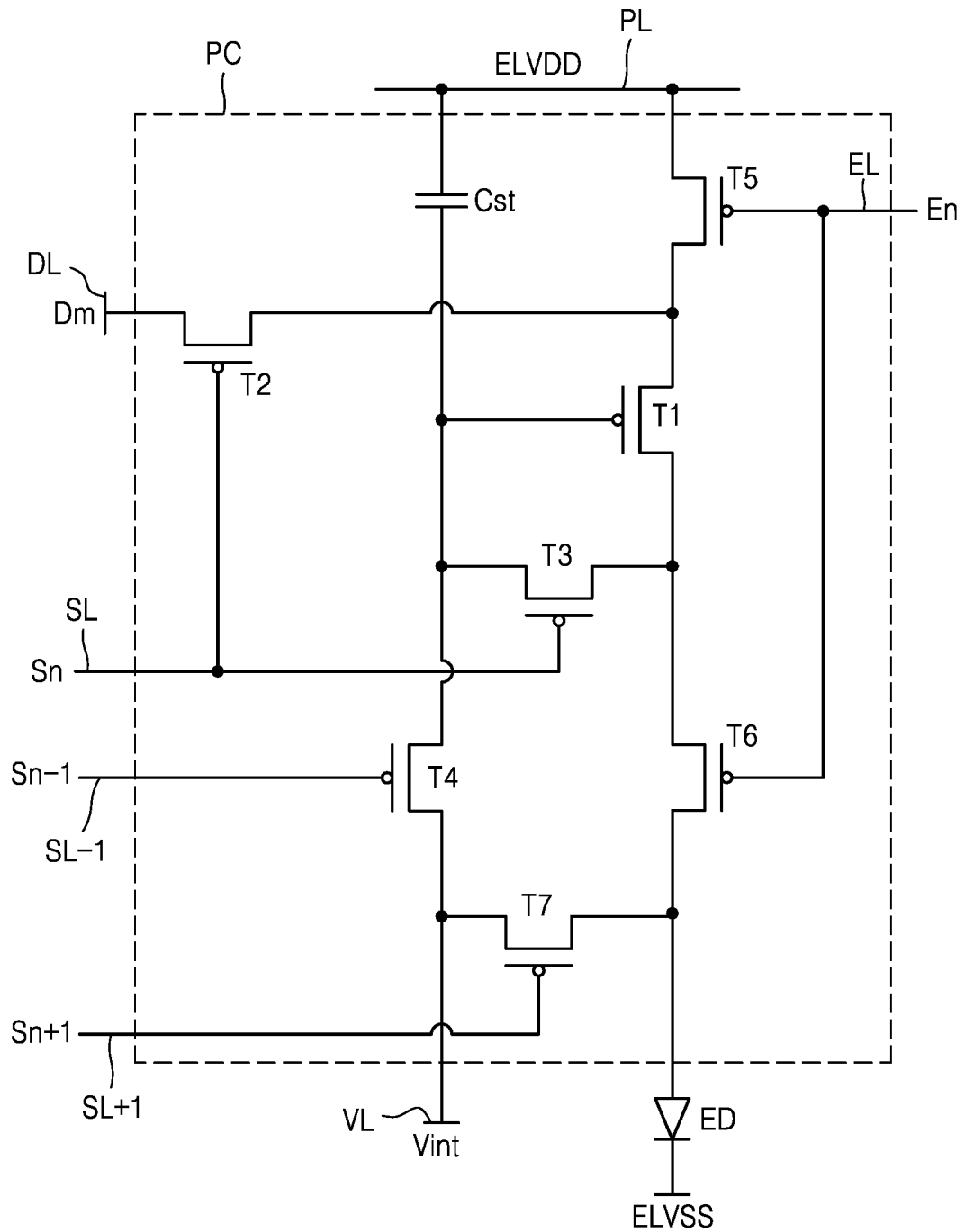

FIGS. 12A and 12B are circuit diagrams illustrating a pixel of the display device DP illustrated in FIG. 10.

Referring to FIGS. 12A and 12B, the pixel circuit PC may be connected to a light-emitting diode ED to realize light emission of the sub-pixels. The pixel circuit PC may include a driving thin-film transistor T1, a switching thin-film transistor T2, and a storage capacitor Cst. The switching thin-film transistor T2 may be connected to a scan line SL and a data line DL, and may be configured to transfer a data signal Dm input via the data line DL to the driving thin-film transistor T1 according to a scan signal Sn input via the scan line SL.

The storage capacitor Cst may be connected to the switching thin-film transistor T2 and a driving voltage line PL, and may store a voltage corresponding to a difference between a voltage received from the switching thin-film transistor T2 and a driving voltage ELVDD supplied to the driving voltage line PL.

The driving thin-film transistor T1 may be connected to the driving voltage line PL and the storage capacitor Cst, and may control a driving current flowing from the driving voltage line PL to the light-emitting element ED in accordance with a voltage value stored in the storage capacitor Cst. The light-emitting element ED may emit light of a desired brightness (e.g., a predetermined or certain brightness) according to the driving current.

While FIG. 12A illustrates the pixel circuit PC as including two thin-film transistors and one storage capacitor, the present disclosure is not limited thereto.

For example, referring to FIG. 12B, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

While FIG. 12B shows that each pixel circuit PC includes signal lines, or in other words, a scan line SL, a previous scan line SL−1, a next scan line SL+1, an emission control line EL, and a data line DL, as well as an initialization voltage line VL, and the driving voltage line PL, the present disclosure is not limited thereto. According to another embodiment, at least one of the scan line SL, the previous scan line SL−1, the next scan line SL+1, the emission control line EL, and the data line DL and/or the initialization voltage line VL may be shared among neighboring circuits (e.g., adjacent circuits).

A drain electrode of the driving thin-film transistor T1 may be electrically connected to the light-emitting element ED via the emission control thin-film transistor T6. The driving thin-film transistor T1 supplies a driving current to the light-emitting element ED by receiving a data signal Dm according to a switching operation of the switching thin-film transistor T2.

A gate electrode of the switching thin-film transistor T2 is connected to the scan line SL, and a source electrode of the switching thin-film transistor T2 is connected to the data line DL. A drain electrode of the switching thin-film transistor T2 may be connected to a source electrode of the driving thin-film transistor T1, and may also be connected to the driving voltage line PL via the operation control thin-film transistor T5.

The switching thin-film transistor T2 may be turned on according to the scan signal Sn received via the scan line SL, to perform a switching operation of transferring the data signal Dm transferred via the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1, and may also be connected to a pixel electrode of the light-emitting element ED via the emission control thin-film transistor T6. A drain electrode of the compensation thin-film transistor T3 may be connected to any one electrode of the storage capacitor Cst, a source electrode of the first initialization thin-film transistor T4, and a gate electrode of the driving thin-film transistor T1. The compensation thin-film transistor T3 may be turned on according to the scan signal Sn received via the scan line SL, to connect the gate electrode and the drain electrode of the driving thin-film transistor T1 to each other, thereby diode-connecting the driving thin-film transistor T1.

A gate electrode of the first initialization thin-film transistor T4 may be connected to the previous scan line SL−1. A drain electrode of the first initialization thin-film transistor T4 may be connected to the initialization voltage line VL. The source electrode of the first initialization thin-film transistor T4 may be connected to any one electrode of the storage capacitor Cst, the drain electrode of the compensation thin-film transistor T3, and the gate electrode of the driving thin-film transistor T1. The first initialization thin-film transistor T4 may be turned on according to the previous scan signal Sn−1 received via the previous scan line SL−1, to perform an initialization operation of transferring an initialization voltage Vint to the gate electrode of the driving thin-film transistor T1 to initialize a voltage of the gate electrode of the driving thin-film transistor T1.

A gate electrode of the operation control thin-film transistor T5 may be connected to the emission control line EL. A source electrode of the operation control thin-film transistor T5 may be connected to the driving voltage line PL. A drain electrode of the operation control thin-film transistor T5 may be connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the light-emitting element ED. The operation control thin-film transistor T5 and the emission control thin-film transistor T6 may be concurrently (e.g., simultaneously) turned on via an emission control signal En received via the emission control line EL, to transfer the driving voltage ELVDD to the light-emitting element ED, such that a driving current flows through the light-emitting element ED.

A gate electrode of the second initialization thin-film transistor T7 may be connected to a next scan line SL+1. A source electrode of the second initialization thin-film transistor T7 may be connected to the pixel electrode of the light-emitting element ED. A drain electrode of the second initialization thin-film transistor T7 may be connected to the initialization voltage line VL. The second initialization thin-film transistor T7 may be turned on according to a next scan signal Sn+1 received via the next scan line SL+1, to thereby initialize the pixel electrode of the light-emitting element ED.

While the first initialization thin-film transistor T4 and the second initialization thin-film transistor T7 are connected to the previous scan line SL−1 and the next scan line SL+1 in FIG. 12B, respectively, the present disclosure is not limited thereto. According to another embodiment, the first initialization thin-film transistor T4 and the second initialization thin-film transistor T7 may both be connected to the same scan line (e.g., the previous scan line SL−1) to be driven according to the same scan signal (e.g., the previous scan signal Sn−1).

The any one electrode of the storage capacitor Cst may be connected to each of the gate electrode of the driving thin-film transistor T1, the drain electrode of the compensation thin-film transistor T3, and the source electrode of the first initialization thin-film transistor T4. The other electrode of the storage capacitor Cst may be connected to the driving voltage line PL.

An opposite electrode of the light-emitting element ED (e.g., a cathode) receives a common voltage ELVSS. The light-emitting element ED emits light by receiving the driving current from the driving thin-film transistor T1.

The pixel circuit PC is not limited to the number of the thin-film transistors and the number of the storage capacitors shown in FIGS. 12A and 12B, and the circuit design described with reference to FIGS. 12A and 12B, the number of thin-film transistors, the number of storage capacitors, and the circuit design of the pixel circuit PC may be modified in various suitable manners.

According to one or more embodiments of the present disclosure, the apparatus and method for manufacturing a display device may obtain data on properties of an adhesive member through various experiments. According to one or more embodiments of the present disclosure, the apparatus and method for manufacturing a display device may obtain the data on properties of an adhesive member in an environment that is the same or substantially the same as (or similar to) an environment of actual processes (e.g., actual manufacturing processes).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A method of manufacturing a display device, the method comprising:
    arranging an adhesive member on a jig portion;
    arranging a member on a stage to be spaced apart from the adhesive member;
    attaching the adhesive member to the member by linearly moving the jig portion in a first direction to press the adhesive member directly onto the member;
    separating the adhesive member from the member by linearly moving the jig portion in a second direction opposite to the first direction; and
    measuring a force or a pressure applied to the jig portion when attaching the adhesive member to the member or separating the adhesive member from the member.

2. The method of claim 1, further comprising controlling a temperature of at least one of the adhesive member or the member.

3. The method of claim 1, further comprising applying an amount of the force or the pressure to the adhesive member by using the jig portion when attaching the adhesive member to the member.

4. The method of claim 3, further comprising applying the amount of the force or the pressure for a period of time.

5. A method of manufacturing a display device, the method comprising:
    arranging an adhesive member on a jig portion;
    arranging a member on a stage;
    attaching the adhesive member to the member by linearly moving the jig portion;
    separating the adhesive member from the member by linearly moving the jig portion; and
    measuring a force or a pressure applied to the jig portion when attaching the adhesive member to the member or separating the adhesive member from the member,
    wherein the measuring of the force or the pressure applied to the jig portion comprises measuring a lowest value of the force or the pressure applied to the jig portion when separating the adhesive member from the member.

6. The method of claim 1, further comprising fixing an end of the adhesive member to the jig portion.

7. The method of claim 1, further comprising linearly moving the stage.

8. The method of claim 1, further comprising measuring a time when a target force or a target pressure is reached according to a type of the adhesive member.

9. A method of manufacturing a display device, the method comprising:
    arranging an adhesive member on a jig portion;
    arranging a member on a stage;
    attaching the adhesive member to the member by linearly moving the jig portion;
    separating the adhesive member from the member by linearly moving the jig portion;
    measuring a force or a pressure applied to the jig portion when attaching the adhesive member to the member or separating the adhesive member from the member; and
    calculating an area of a graph corresponding a variation in a pressure applied by the jig portion to the adhesive member over time when the jig portion presses the adhesive member, according to a type of the adhesive member.

10. The method of claim 1, further comprising varying the force or the pressure applied to the member by using the adhesive member.

11. The method of claim 1, wherein a temperature controlling portion is located between the member and the stage.

12. The method of claim 11, further comprising controlling a temperature of at least one of the jig portion or the temperature controlling portion.

* * * * *